US012800959B2

(12) United States Patent
Cao et al.

(10) Patent No.: US 12,800,959 B2
(45) Date of Patent: Nov. 17, 2026

(54) DOUBLE-SIDED DISPLAY DEVICE AND DRIVING METHOD THEREOF

(71) Applicant: HKC CORPORATION LIMITED, Shenzhen (CN)

(72) Inventors: Zhonglin Cao, Shenzhen (CN); Junfeng Xie, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 25 days.

(21) Appl. No.: 18/974,847

(22) Filed: Dec. 10, 2024

(65) Prior Publication Data

US 2025/0199351 A1 Jun. 19, 2025

(30) Foreign Application Priority Data

Dec. 19, 2023 (CN) ......................... 202311751989.5

(51) Int. Cl.

*G02F 1/1333* (2006.01)
*F21V 8/00* (2006.01)
*G02F 1/1335* (2006.01)
*G09G 3/3208* (2016.01)
*G09G 3/34* (2006.01)

(Continued)

(52) U.S. Cl.

CPC ..... *G02F 1/133342* (2021.01); *G02B 6/0081* (2013.01); *G02F 1/133512* (2013.01); *G02F 1/133616* (2021.01); *G09G 3/3208* (2013.01); *G09G 3/3406* (2013.01); *G09G 3/36* (2013.01); *H10K 59/128* (2023.02); *H10K 59/50* (2023.02); *G02B 6/0051* (2013.01); *G02F 2201/44* (2013.01); *G09G 2340/0435* (2013.01); *G09G 2360/144* (2013.01); *G09G 2360/145* (2013.01)

(58) Field of Classification Search

CPC ......... G02F 1/133342; G02F 1/133512; G02F 1/133616; G02B 6/0081; G09G 3/3208; G09G 3/3406; G09G 3/36; G09G 2360/144; G09G 2360/145; H10K 59/128; H10K 59/50

See application file for complete search history.

(56) References Cited

U.S. PATENT DOCUMENTS

2005/0052383 A1* 3/2005 Suzuki .................. G06F 1/1616 345/87
2012/0176570 A1 7/2012 Yamazaki et al.

FOREIGN PATENT DOCUMENTS

CN 201429935 Y 3/2010
CN 105629541 A 6/2016

(Continued)

*Primary Examiner* — Scott D Au

(57) ABSTRACT

A double-sided display device and a driving method thereof are disclosed. The double-sided display device includes an LCD panel and an OLED panel oppositely arranged. A light diffusion structure is arranged between the OLED panel and the LCD panel. A light shielding layer is arranged between the light diffusion structure and the OLED panel. The light shielding layer has a width less than that of an opening area of each pixel of the LCD panel. The organic light-emitting layer emits light in a first direction and a second direction opposite to the first direction. The light in the first direction is partially shielded by the light shielding layer, and partially passes through the light diffusion structure to reach the opening area to realize display of the LCD panel. The light in the second direction displays a front side image on a display surface of the OLED panel.

18 Claims, 8 Drawing Sheets

(51) Int. Cl.

| | |
|---|---|
| ***G09G 3/36*** | (2006.01) |
| ***H10K 59/128*** | (2023.01) |
| ***H10K 59/50*** | (2023.01) |

(56) References Cited

FOREIGN PATENT DOCUMENTS

| | | | | |
|---|---|---|---|---|
| CN | 110543050 A | | 12/2019 | |
| CN | 116841073 | * | 10/2023 | ....... G02F 1/133342 |
| CN | 116841073 A | | 10/2023 | |

* cited by examiner

DOUBLE-SIDED DISPLAY DEVICE AND DRIVING METHOD THEREOF

CROSS-REFERENCE TO RELATED APPLICATIONS

This application claims the priority and benefit of Chinese patent application number 2023117519895, titled "Double-sided Display Device and Driving Method Thereof" and filed Dec. 19, 2023 with China National Intellectual Property Administration, the entire contents of which are incorporated herein by reference.

TECHNICAL FIELD

This application relates to the field of display technology, and more particularly relates to a double-sided display device and a driving method thereof.

BACKGROUND

The description provided in this section is intended for the mere purpose of providing background information related to the present application but doesn't necessarily constitute prior art.

For the time being, most display panels on the market are mainly single-sided displays. In many occasions, such as digital signages, electronic communications equipment, cashier facilities, window inquiry facilities, or advertising playback facilities in public places such as exhibition halls, two people may be required to watch the displayed images from both front and rear sides of the display panel at the same time.

Possible double-sided display devices may be two OLED (Organic Light Emitting Diode) panels or liquid crystal display panels (LCD) placed opposite to each other. LCD products cannot meet the requirements of lightness, thinness, fast response and low power consumption. OLED panels have gradually become the mainstream display technology due to their advantages of fast response speed, wide operating temperature range, high contrast, large viewing angle, ultra-thin panels, flexible display, and transparent display. Therefore, double-sided display devices may be formed by stacking two OLED panels together. However, the double-layer OLED panel not only has a large power consumption, but is high in cost, resulting in weak market competitiveness.

SUMMARY

It is therefore one purpose of the present application to provide a double-sided display device and a driving method thereof, so as to reduce power consumption and cost, improve the quality of the double-sided display images of the double-sided display device, thus enhancing market competitiveness.

The present application discloses a double-sided display device. The double-sided display device includes a liquid crystal display panel and an organic light-emitting display panel arranged opposite to each other. The organic light-emitting display panel includes an organic light-emitting layer. A light diffusion structure is arranged between each pixel of the organic light-emitting display panel and the respective pixel of the liquid crystal display panel. A light shielding layer is arranged between the light diffusion structure and each pixel of the organic light-emitting display panel. The width of the light shielding layer is smaller than the opening area of the pixel of the liquid crystal display panel. The organic light-emitting layer emits light in a first direction and a second direction. The first direction and the second direction are opposite directions. Part of the light in the first direction is shielded by the light shielding layer. Part of the light passes through the light diffusion structure to reach the opening area to realize the display of the liquid crystal display panel. The light in the second direction displays a front side image on a display surface of the organic light-emitting display panel.

In some embodiments, the light diffusion structure includes a light guide plate and a diffusion sheet. The light guide plate is arranged between the diffusion sheet and the liquid crystal display panel. The width of the light guide plate is greater than the width of the opening area of the pixel of the liquid crystal display panel and less than or equal to the width of the diffusion sheet. The double-sided display device includes a brightness detection module and a light source compensation module. The brightness detection module obtains an actual display brightness. The light source compensation module includes a light source and a compensation circuit. The compensation circuit is electrically connected to the light source. The light source is arranged on a side of the light guide plate. The brightness detection module is electrically connected to the compensation circuit, obtains the actual display brightness of the liquid crystal display panel, and compares the actual display brightness with the target brightness to obtain a compensation brightness. The compensation circuit inputs a corresponding electrical signal to the light source according to the compensation brightness to control a light-emitting brightness of the light source.

In some embodiments, the double-sided display device includes a first reflection layer. The first reflection layer is arranged between the light shielding layer and the light diffusion structure. The first reflection layer is arranged to cover the side of the light shielding layer adjacent to the liquid crystal display panel.

In some embodiments, an electrochromic layer is arranged between the diffusion sheet and the organic light-emitting display panel. The electrochromic layer and the light shielding layer are arranged in the same layer. A transparent glass substrate is arranged between the electrochromic layer and the diffusion sheet.

A sum of the widths of the electrochromic layer and the light shielding layer is equal to a sum of the widths of the opening areas of the pixels of the liquid crystal display panel. A black matrix is further disposed in the pixel area of the pixel of the liquid crystal display panel. The opening area is formed between the black matrices. A sum of the width of the black matrix and a width of the pixel opening area is equal to a sum of the widths of the organic light-emitting layers.

In some embodiments, the organic light-emitting layer emits white light. The light source is arranged around the liquid crystal display panel. The light source includes a white light OLED, and a reflection film layer is disposed above and below the reflection film layer. The OLED white light source is guided into the display area of the liquid crystal display panel by the light guide plate for use.

In some embodiments, the light source is arranged around the liquid crystal display panel. The light source includes a white light OLED. The white light OLED is arranged in the same layer as the organic light-emitting layer. The liquid crystal panel includes a second reflection layer in the area corresponding to the white light OLED. The organic light-emitting display panel includes an opaque section in the area corresponding to the white light OLED.

The present application further discloses a double-sided display device. The double-sided display device includes a liquid crystal display panel and an organic light-emitting display panel that are arranged opposite to each other. The organic light-emitting display panel includes an organic light-emitting layer. A light diffusion structure is arranged between each pixel of the organic light-emitting display panel and the respective pixel of the liquid crystal display panel. A light shielding layer is arranged between the light diffusion structure and each pixel of the organic light-emitting display panel. The width of the light shielding layer is smaller than the opening area of the pixel of the liquid crystal display panel. The organic light-emitting layer emits light in a first direction and a second direction. The first direction and the second direction are opposite directions. Part of the light in the first direction is shielded by the light shielding layer. Part of the light passes through the light diffusion structure to reach the opening area to realize the display of the liquid crystal display panel. The light in the second direction displays a front side image on a display surface of the organic light-emitting display panel. An electrochromic layer is arranged between the light diffusion structure and the organic light-emitting display panel. The electrochromic layer and the light shielding layer are arranged in the same layer. A transparent glass substrate is arranged between the electrochromic layer and the light diffusion structure. A sum of the widths of the electrochromic layer and the light shielding layer is equal to the sum of the widths of the opening areas of the pixels of the liquid crystal display panel. A black matrix is further disposed in the pixel area of the pixel of the liquid crystal display panel. The opening area is formed between the black matrices. The sum of the width of the black matrix and the width of the pixel opening area is equal to the sum of the widths of the organic light-emitting layers.

The present application further discloses a driving method of a double-sided display device, which is used to drive the double-sided display device. The double-sided display device includes a liquid crystal display panel and an organic light-emitting display panel that are arranged opposite to each other. The organic light-emitting display panel includes an organic light-emitting layer. A light diffusion structure is arranged between each pixel of the organic light-emitting display panel and the respective pixel of the liquid crystal display panel. A light shielding layer is arranged between the light diffusion structure and each pixel of the organic light-emitting display panel. The width of the light shielding layer is smaller than the opening area of the pixel of the liquid crystal display panel.

The organic light-emitting layer emits light in a first direction and a second direction. The first direction and the second direction are opposite directions. The light in the first direction is partially shielded by the light shielding layer. Part of the light passes through the light diffusion structure to reach the opening area to realize the display of the liquid crystal display panel. The light in the second direction displays a front side image on a display surface of the organic light-emitting display panel. The driving method includes:

inputting a driving signal of the organic light-emitting display panel, and controlling the organic light-emitting layer in the organic light-emitting display panel to emit light in a first direction and a second direction;

obtaining a brightness of light emitted by the organic light-emitting layer in the first direction after diffusion by a light diffusion structure, as a backlight brightness of the liquid crystal display panel; and generating a driving signal of the liquid crystal display panel based on the backlight brightness and the signal source data of the liquid crystal display panel;

where the first direction and the second direction are opposite directions, the light in the first direction displays a back side image on a display surface of the liquid crystal display panel, and the light in the second direction displays a front side image on a display surface of the organic light-emitting display panel.

In some embodiments, the light diffusion structure includes a light guide plate and a diffusion plate. The light guide plate is arranged between the light diffusion structure and the liquid crystal display panel. A light source for supplementing light is arranged on a side of the light guide plate. The operation of obtaining the brightness of the light emitted by the organic light-emitting layer in the first direction after being diffused by the light diffusion structure as the backlight brightness of the liquid crystal display panel includes:

obtaining the actual display brightness of the liquid crystal display panel, and comparing the actual display brightness with the target brightness to calculate and obtain the compensation brightness, and controlling an opening degree of the light source according to the compensation brightness so that the light of the light source enters the light guide plate; and using the brightness of the light emitted by the organic light-emitting layer in the first direction and the light emitted by the light source into the light guide plate after passing through the light guide plate as the backlight brightness of the liquid crystal display panel.

In some embodiments, the organic light-emitting display panel includes a refresh rate adjusting module. The refresh rate adjusting module controls the refresh rate of the organic light-emitting display panel. The operation of generating a driving signal of the liquid crystal display panel based on the backlight brightness and the source data of the liquid crystal display panel includes:

obtaining the actual display brightness of the liquid crystal display panel of the current frame, and comparing the actual display brightness with the target brightness to calculate and obtain a compensation brightness, and controlling the refresh rate adjusting module to increase the refresh rate of the organic light-emitting display panel according to the compensation brightness, so as to increase the light-emitting brightness of the organic light-emitting layer of the organic light-emitting display panel in the next frame.

In some embodiments, an electrochromic layer is arranged between the light diffusion structure and the organic light-emitting display panel. The electrochromic layer and the light shielding layer are arranged in the same layer. The sum of the widths of the electrochromic layer and the light shielding layer is greater than or equal to the sum of the widths of the opening areas of the pixels of the liquid crystal display panel. After the operation of generating the driving signal of the liquid crystal display panel based on the backlight brightness and the signal source data of the liquid crystal display panel, the following operation are further included:

S4: detecting a display mode of the double-sided display device, if it is double-sided display, controlling the electrochromic layer to be transparent, inputting the driving signal of the organic light-emitting display panel, and controlling the organic light-emitting layer in the organic light-emitting display panel to emit light in the first direction and the second direction; if it is single-sided display, inputting the driving signal of the organic light-emitting display panel, controlling the organic light-emitting layer in the organic light-emitting display panel not to emit light in the first direction and the second direction, and turning on the light source according to the signal source data of the liquid crystal display panel; or inputting the driving signal of the organic light-emitting display panel, controlling the organic light-emitting layer 111 in the organic light-emitting display panel to emit light in the first direction and the second direction, controlling the electrochromic layer to be opaque, and turning off the light source.

Compared with the possible display devices realizing double-sided display by stacking LCD screens or OLED screens, the present application takes into account the problem that the stacked display panels have a relatively large thickness or high power consumption, so the double-sided display device is no longer formed by stacking LCD screens, but uses a liquid crystal display panel and an organic light-emitting display panel that are stacked together as a double-sided display, and the backlight module of the liquid crystal display panel is removed. The organic light-emitting layer of the organic light-emitting display panel can emit light in the first direction and the second direction in opposite directions, respectively realizing display on the display surfaces of the two panels, and realizing a shared backlight. In order to prevent the light-emitting layer of the organic light-emitting display panel from affecting the display of the liquid crystal display panel, a partial light-shielding area is set between the two panels to form a semi-transparent and semi-opaque area. Therefore, the light emitted by the organic light-emitting layer is fully utilized, and the light passing through the organic light-emitting layer from the transparent section is mixed through the light diffusion structure. The light shielding layer can prevent the luminous area of the organic light-emitting layer from affecting the display area of the liquid crystal display panel, which is beneficial to reducing the thickness and power consumption of the entire double-sided display device, and at the same time improving the double-sided display effect of the double-sided display device.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principles of the present application in conjunction with the text description. Apparently, the drawings in the following description merely represent some embodiments of the present disclosure, and for those having ordinary skill in the art, other drawings may also be obtained based on these drawings without investing creative. In the drawings.

Figure 1:
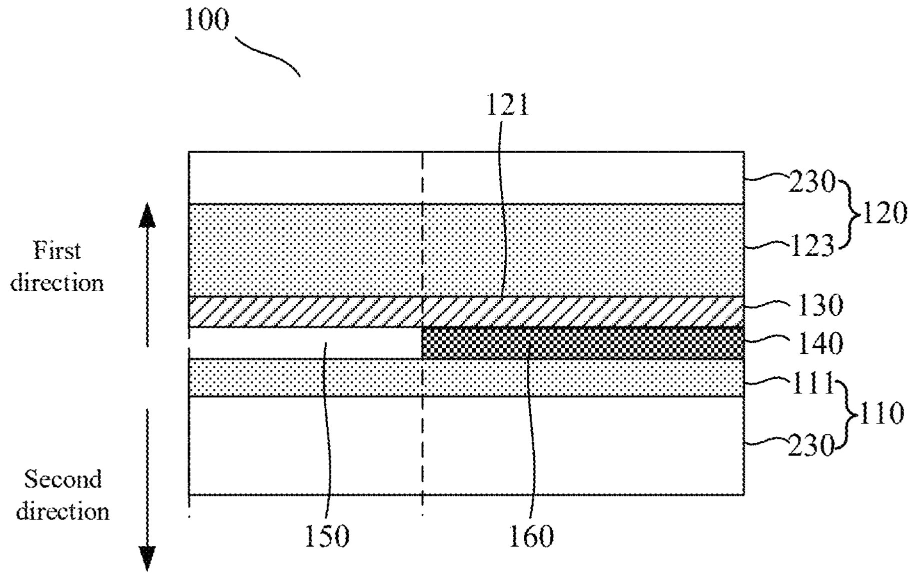
FIG. 1 is a schematic diagram of a double-sided display device according to a first embodiment of the present application.

In the drawings: 100, double-sided display device; 110, organic light-emitting display panel; 111, organic light-emitting layer; 120, liquid crystal display panel; 121, opening area; 122, black matrix; 123, liquid crystal layer; 130, light diffusion structure; 131, diffusion sheet; 132, light guide plate; 140, light shielding layer; 150, transparent section; 160, opaque section; 170, first reflection layer; 180, second reflection layer; 190, refresh rate adjusting module; 200, electrochromic layer; 210, brightness detection module; 220, light source compensation module; 221, light source; 222, compensation circuit; 230, glass substrate; 240, reflection film layer.

DETAILED DESCRIPTION OF EMBODIMENTS

It should be understood that the terms used herein, the specific structures and functional details disclosed therein are merely representative for describing some specific embodiments, but the present application can be implemented in many alternative forms and should not be construed as being limited to only these embodiments described herein.

The present application will be described in detail below with reference to the accompanying drawings and some optional embodiments.

Embodiment 1

Referring to FIG. 1, as a first embodiment of the present application, a double-sided display device 100 is disclosed. The double-sided display device 100 in this embodiment can be driven using the driving method described in any of the above embodiments. The liquid crystal display panel 120 and the organic light-emitting display panel 110 of the double-sided display device 100 each include a plurality of pixels. The liquid crystal display panel 120 and the organic light-emitting display panel 110 both include respective driving circuits. The liquid crystal display panel 120 includes a liquid crystal layer 123. A light diffusion structure 130 is disposed between each pixel of the organic light-emitting display panel 110 and the respective pixel of the liquid crystal display panel 120. A light shielding layer 140 is disposed between the light diffusion structure 130 and each pixel of the organic light-emitting display panel 110. The width of the light shielding layer 140 is smaller than the opening area 121 of a pixel of the liquid crystal display panel 120. The driving circuit of the organic light-emitting display panel 110 inputs a driving signal to the organic light-emitting layer 111 of the corresponding pixel, and controls the organic light-emitting layer 111 in the organic light-emitting display panel 110 to emit light in both the first direction and the second direction. The driving circuit of the liquid crystal display panel 120 generates and outputs a driving signal of the liquid crystal display panel 120 to the corresponding pixel based on the backlight brightness and the signal source data of the liquid crystal display panel 120 to realize display.

The present application no longer uses two liquid crystal screens or two organic light-emitting display panels 110 stacked together to form a double-sided display device 100, but uses a liquid crystal display panel 120 and an organic light-emitting display panel 110 that are stacked together as a double-sided display. Glass substrates 230 are disposed on both the upper and lower sides, and the backlight module of the liquid crystal display panel 120 is removed. The organic light-emitting layer 111 of the organic light-emitting display panel 110 can emit light in the first direction and the second direction in opposite directions, respectively realizing display on the display surfaces of the two panels, and realizing a shared backlight. In order to prevent the light-emitting layer of the organic light-emitting display panel 110 from affecting the display of the liquid crystal display panel 120, a partial light-shielding area is set between the two panels to form a semi-transparent and semi-opaque area. Therefore, the light emitted by the organic light-emitting layer 111 is fully utilized, and the light passing through the organic light-emitting layer 111 from the transparent section 150 domain is mixed through the light diffusion structure 130, so that the OLED transmitted light and the ambient light source 221 can be better dispersed and introduced into the display area, and the display brightness and uniformity on the LCD side can be further increased. The light shielding layer 140 can prevent the luminous area of the organic light-emitting layer 111 from affecting the display area of the liquid crystal display panel 120, which is beneficial to reducing the thickness and power consumption of the entire double-sided display device 100, and at the same time improving the double-sided display effect of the double-sided display device 100.

Embodiment 2

Figure 2:
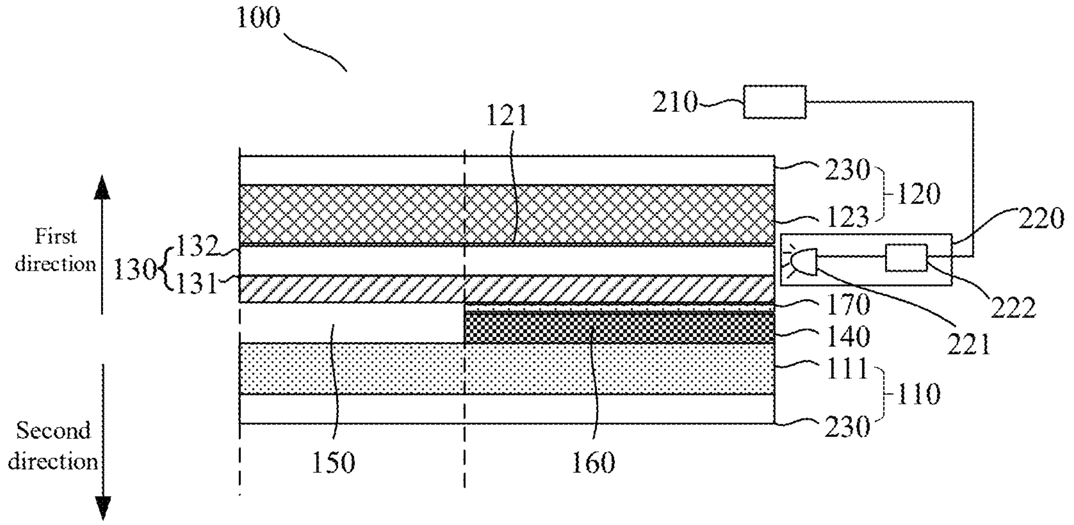
FIG. 2 is a schematic diagram of a double-sided display device according to a second embodiment of the present application.

Referring to FIG. 2, as a second embodiment of the present application, it is a further refinement of the first embodiment. The light diffusion structure 130 includes a diffusion sheet 131 and a light guide plate 132. The light guide plate 132 is arranged between the diffusion sheet 131 and the liquid crystal display panel 120. The width of the light guide plate 132 is greater than the width of the opening area 121 of the pixel of the liquid crystal display panel 120, and is less than or equal to the width of the diffusion sheet 131. The double-sided display device 100 includes a brightness detection module 210 and a light source compensation module 220. The brightness detection module 210 obtains the actual display brightness. The light source compensation module 220 includes a light source 221 and a compensation circuit 222. The compensation circuit 222 is electrically connected to the light source 221. The light source 221 is arranged on a side of the light guide plate 132. The brightness detection module 210 is electrically connected to the compensation circuit 222 to obtain the actual display brightness of the liquid crystal display panel 120, and compare the actual display brightness with a target brightness to obtain a compensation brightness. The compensation circuit 222 inputs a corresponding electrical signal to the light source 221 according to the compensation brightness to control a light-emitting brightness of the light source 221. The light emitted by the light source 221 enters the light guide plate 132 and mixes with the light of the organic light-emitting layer 111 passing through the diffusion sheet 131 thus forming the backlight of the liquid crystal display panel 120.

Further, the double-sided display device 100 includes a first reflection layer 170. The first reflection layer 170 is arranged between the light shielding layer 140 and the light diffusion structure 130. The first reflection layer 170 is arranged to cover the side of the light shielding layer 140 adjacent to the liquid crystal display panel 120.

Separately, on the LCD side, a semi-transparent and semi-reflective design is adopted. Specifically, the opening area 121 of the LCD is divided into a reflective area and a transmissive area, where the transmissive area corresponds to the transparent section 150, and the reflective area corresponds to the opaque section 160. The reflection area refers to add a first reflection layer 170 on the side of the LCD adjacent to the OLED. In this way, when the reflection is displayed, the ambient light enters the LCD and then reflects through the reflection film layer 240 for display. The transmission area refers to using the light of the organic light-emitting layer 111 on the lower side, allowing the light of the organic light-emitting layer 111 to penetrate the transmission area and be displayed after passing through the LCD pixel. In this way, the light of the organic light-emitting layer 111 is used, and the ambient light source 221 is used at the same time. The two are superimposed for LCD side display, achieving a desired power saving effect, and the reflection effect is better when displayed outdoors.

Embodiment 3

Figure 3:
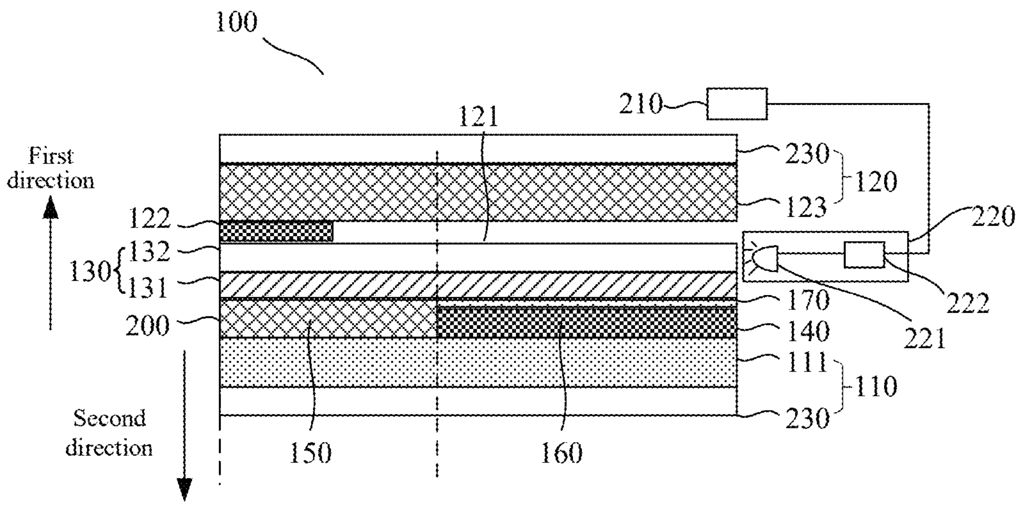
FIG. 3 is a schematic diagram of a double-sided display device according to a third embodiment of the present application.

Referring to FIG. 3, as a third embodiment of the present application, an electrochromic layer 200 is arranged between the light diffusion structure 130 and the organic light-emitting display panel 110. The electrochromic layer 200 and the light shielding layer 140 are arranged in the same layer. In order to better stack the two panels, a glass substrate 230 may be arranged between the two panels. The glass substrate 230 may be transparent and may be placed between the electrochromic layer 200 and the light diffusion structure 130. The sum of the widths of the electrochromic layer 200 and the light shielding layer 140 is equal to the width of the opening area 121 of the pixel of the liquid crystal display panel 120. A black matrix 122 is further disposed in the pixel area of the pixels of the liquid crystal display panel 120. The opening area 121 is defined in between the black matrix 122. The sum of the width of the black matrix 122 and the width of the pixel opening area 121 is equal to the sum of the width of the organic light-emitting layer 111.

In this embodiment, the switching between single-sided and double-sided display can be realized by adding the electrochromic layer 200. Furthermore, on the basis of setting the light source 221, the liquid crystal display panel 120 can also displayed separately. The light emitted by the organic light-emitting layer 111 of the OLED panel and passing through the light diffusion structure 130 can be chosen as the backlight of the liquid crystal display panel 120, or the light of the light source 221 disposed on the side after being emitted into the light guide plate 132 can also be used as the backlight of the liquid crystal display panel 120, breaking the limitation that only double-sided display can be performed when the organic light-emitting layer 111 of the OLED is used as the backlight. As such, double-sided display is performed when double-sided display is required, and either side can be chosen for display when double-sided display is not required.

Embodiment 4

Figure 4:
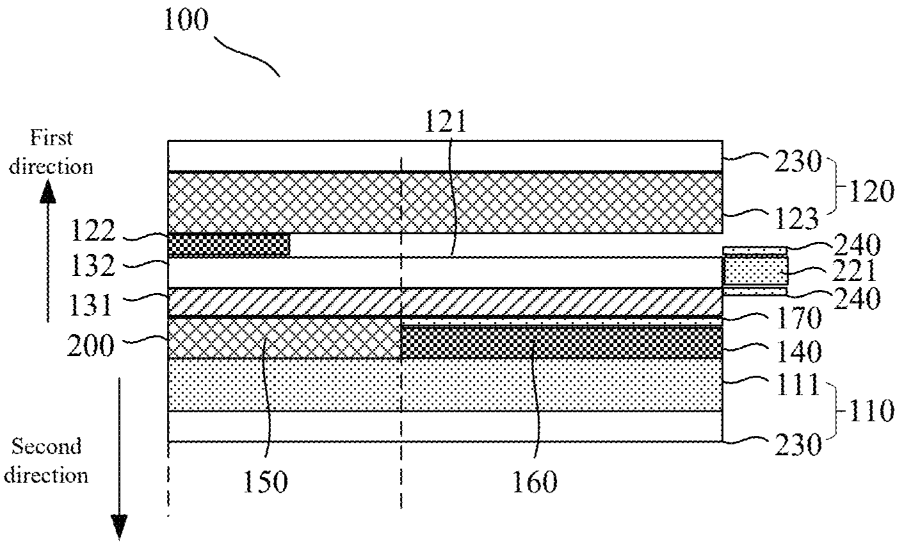
FIG. 4 is a schematic diagram of a double-sided display device according to a fourth embodiment of the present application.
Figure 5:
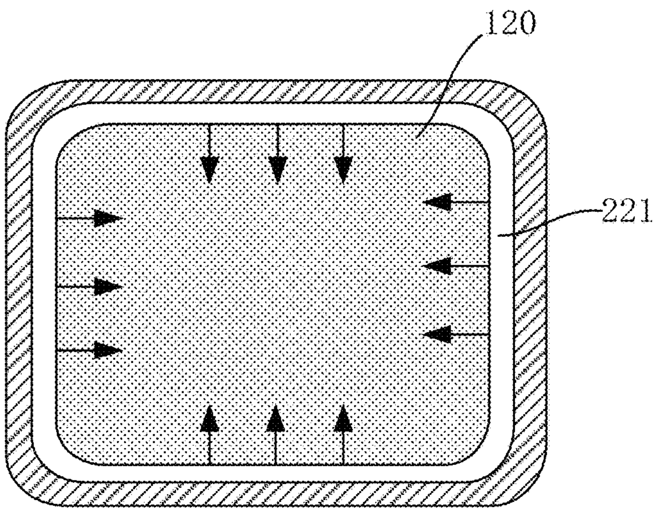
FIG. 5 is a top view of a liquid crystal display panel of a double-sided display device according to the fourth embodiment of the present application.

Referring to FIG. 4 and FIG. 5, as a fourth embodiment of the present application, this embodiment is different from the above embodiments in that this embodiment mainly limits the colors of the organic light-emitting layer 111 and limits the light source 221. The organic light-emitting layer 111 in any of the above embodiments mainly emits white light, but it does not mean that it can only emit white light, and the color can be changed as needed. The light source 221 is arranged around the liquid crystal display panel 120, that is, the four sides of the light guide plate 132. The light source 221 includes a white light OLED. The white light OLED has reflection film layers 240 disposed above and below it respectively, so that the OLED white light source 221 is guided into the display area of the liquid crystal display panel 120 through the light guide plate 132 for use.

The present application designs one or more circles of white light OLED pixels in the non-display area on a periphery the liquid crystal display panel 120 of the double-sided display device 100. These pixels emit white light. Through the diffusion sheet 131 and the light guide plate 132, the surrounding OLED light source 221 can be introduced into the display area for the display light source 221 on the LCD side. This can increase the display brightness of the LCD, especially when the LCD needs to perform single-sided display at night. The surrounding OLED light source 221 provides the display light source 221 of the LCD, realizing single-sided independent display. The OLED pixels in the surrounding light source 221 area are white light OLEDs, and reflection film layers 240 are disposed above and below it respectively, so that the OLED white light source 221 is guided into the display area of the liquid crystal display panel 120 through the light guide plate 132 for use, thereby realizing brightness compensation or independent display of the liquid crystal display panel 120.

Figure 6:
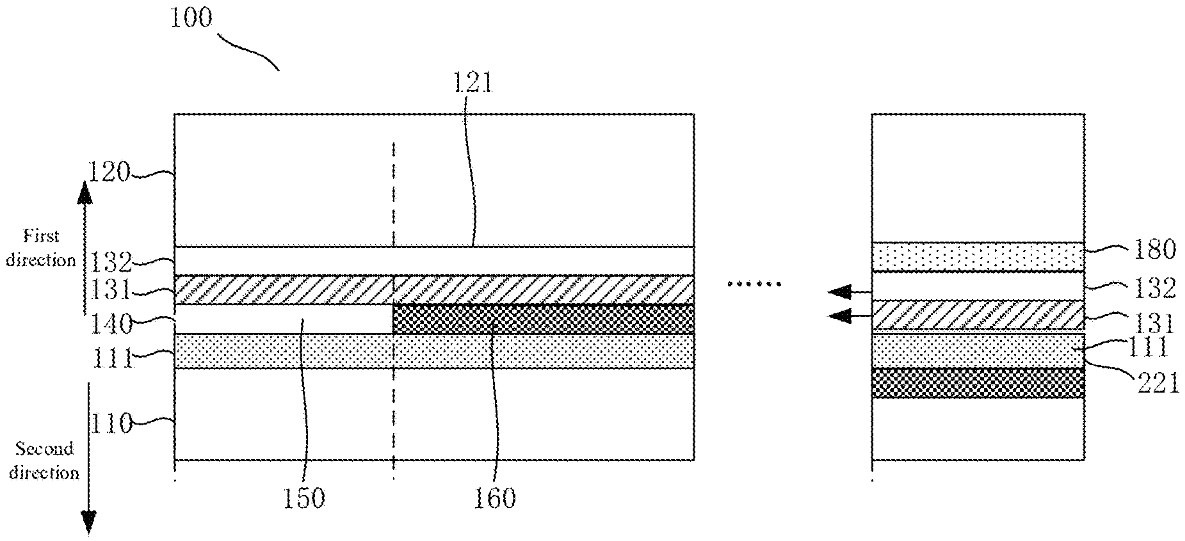
FIG. 6 is a schematic diagram of the double-sided display device according to the fourth embodiment of the present application.

Further, referring to FIG. 6, as another implementation of this embodiment, the light source is arranged around the liquid crystal display panel. The light source 221 includes a white light OLED. The organic light-emitting layer 111 of the white light OLED is arranged in the same layer as the organic light-emitting layer 111. The liquid crystal display panel 120 includes a second reflection layer 180 in the area corresponding to the white light OLED. The organic light-emitting display panel 110 includes an opaque section in the area corresponding to the white light OLED. The white OLED for light supplementation is turned on when light supplementation is needed. The light emitted enters the light guide plate 132 and the diffusion sheet 131 and is then introduced into other displayed pixel areas of the liquid crystal display panel 120 thus enhancing the backlight brightness of the pixels in the display area of the liquid crystal display panel and achieving compensation.

Embodiment 5

Figure 7:
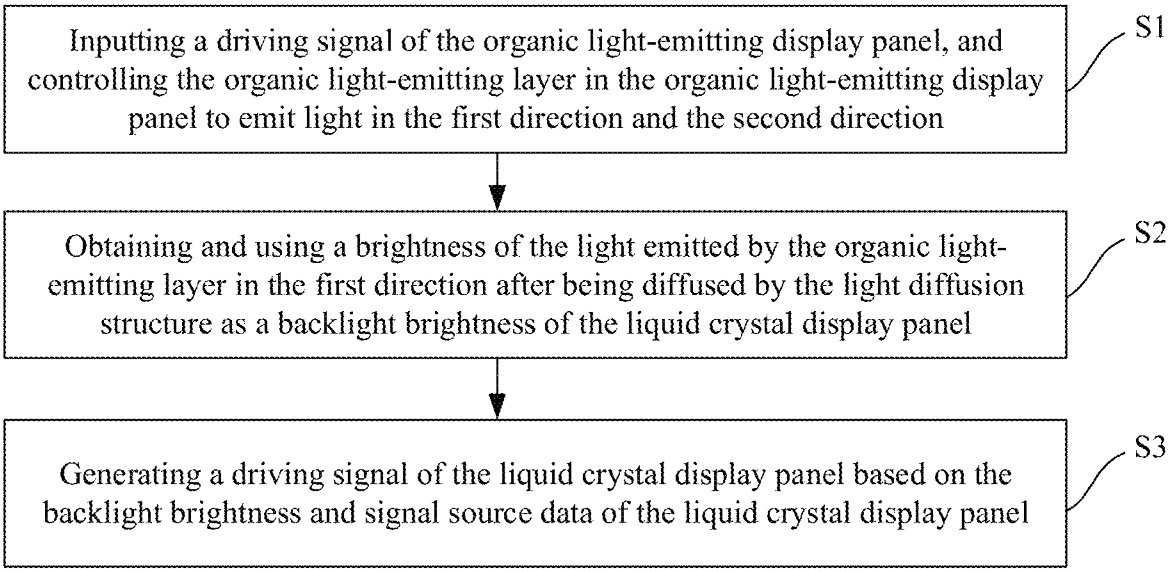
FIG. 7 is a flowchart of a driving method flow according to a fifth embodiment of the present application.
Figure 8:
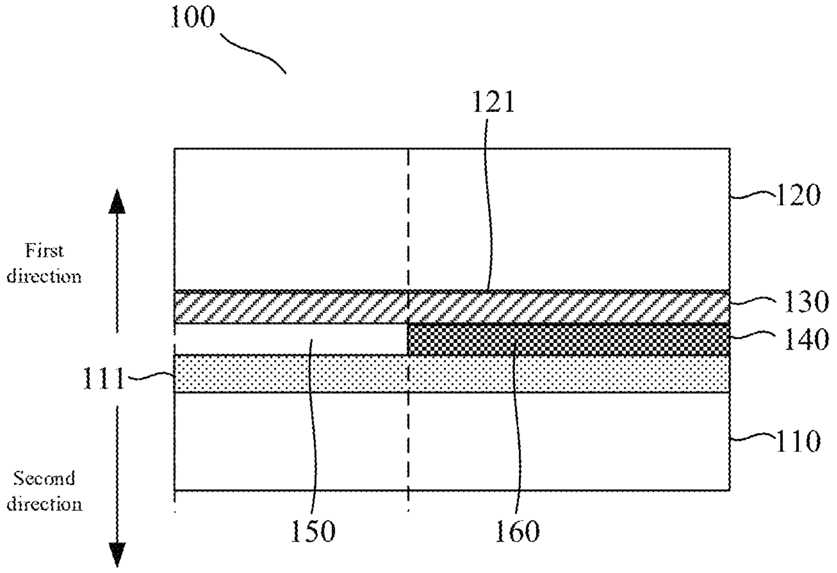
FIG. 8 is a schematic diagram of a double-sided display device according to the fifth embodiment of the present application.

Referring to FIG. 7 and FIG. 8, as a fifth embodiment of the present application, a driving method of a double-sided display device 100 is disclosed. The driving method is used to drive the double-sided display device as described in any of the above embodiments. The double-sided display device 100 includes a liquid crystal display panel 120 and an organic light-emitting display panel 110 arranged opposite to each other. Each pixel of the liquid crystal display panel 120 and the respective pixel of the organic light-emitting display panel 110 are arranged to overlap or coincide with each other. A light diffusion structure 130 is arranged between each pixel of the organic light-emitting display panel 110 and the respective pixel of the liquid crystal display panel 120. A light shielding layer 140 is arranged between the light diffusion structure 130 and each pixel of the organic light-emitting display panel 110. The width of the light shielding layer 140 is smaller than the opening area 121 of the pixel of the liquid crystal display panel 120. The driving method includes the following operations:

- S1: inputting a driving signal of the organic light-emitting display panel, and controlling the organic light-emitting layer in the organic light-emitting display panel to emit light in a first direction and a second direction;
- S2: obtaining a brightness of light emitted by the organic light-emitting layer in the first direction after diffusion by a light diffusion structure, as a backlight brightness of the liquid crystal display panel; and
- S3: generating a driving signal of the liquid crystal display panel based on the backlight brightness and the signal source data of the liquid crystal display panel;

where the first direction and the second direction are opposite directions, the light in the first direction displays a back side image on a display surface of the liquid crystal display panel 120, and the light in the second direction displays a front side image on a display surface of the organic light-emitting display panel 110.

In this embodiment, a light shielding layer 140 is arranged between the organic light-emitting display panel 110 and the liquid crystal display panel 120. Using the characteristics of two-sided light emission of the organic light-emitting layer 111 of the OLED panel, one side allows the OLED panel to display an image normally, and the light emitted from the other side is used as the backlight light source 221 of the LCD panel. The brightness of the organic light-emitting layer 111 has a greater influence on the display of the liquid crystal display panel 120. If the light emitted by the organic light-emitting layer 111 is simply used as the backlight of the liquid crystal display panel 120, the backlight of the liquid crystal display panel 120 may be too bright, and the user can see the organic light-emitting layer 111 of the organic light-emitting display panel 110 through the liquid crystal display panel 120, thereby affecting the user's viewing experience. Therefore, a light shielding layer 140 is arranged between the two panels to partially block the organic light-emitting layer 111. Furthermore, the light in the first direction of the organic light-emitting layer 111 is absorbed and dispersed by the light diffusion structure 130, so that the backlight is more uniform, and the brightness of the organic light-emitting layer 111 is prevented from being too bright, which affects the normal display. First, the driving signal of the organic light-emitting display panel 110 is input to control the organic light-emitting layer 111 in the organic light-emitting display panel 110 to emit light in the first direction and the second direction. Then, the brightness of the light emitted in the first direction by the organic light-emitting layer 111 after being diffused by the light diffusion structure 130 is obtained as the backlight brightness of the liquid crystal display panel 120. Finally, the driving signal of the liquid crystal display panel 120 is generated based on the backlight brightness and the signal source data of the liquid crystal display panel 120 to realize the display of the liquid crystal display panel 120.

The width of the light shielding layer 140 may be smaller than the opening area 121 of the pixel of the liquid crystal display panel 120, and smaller than the width of the organic light-emitting layer 111 in the organic light-emitting display panel 110. The light shielding layer 140 forms an opaque section 160 in the middle space between the two panels. The transparent section 150 is the area where the light shielding layer 140 is not disposed. The widths of the transparent section 150 and the opaque section 160 can be set differently, and this is achieved by adjusting the width of the light shielding layer 140. The width of the opaque section 160 may be set larger than the width of the transparent section 150 to prevent the light emitted by the organic light-emitting layer 111 in the first direction from affecting the display of the liquid crystal display panel 120 due to excessive brightness. The OLED display panel of the present application is an OLED display panel with a COE (Color film on Encapsulation, namely forming a color filter on a thin film encapsulation structure) architecture. It should be noted that COE refers to the Color Filter process of depositing R/G/B color filters on R/G/B pixels after the OLED completes the thin film encapsulation. In order to prevent cross-color between different colors of light, a black matrix 122 (BM) is disposed between different color filters to absorb colored light at the edges of the color filters and natural light in the non-pixel opening area of the environment. Depending on the type of organic light-emitting layer 111, it can be divided into white light OLED, blue light OLED, and true RGB OLED, etc.

Embodiment 6

Figure 9:
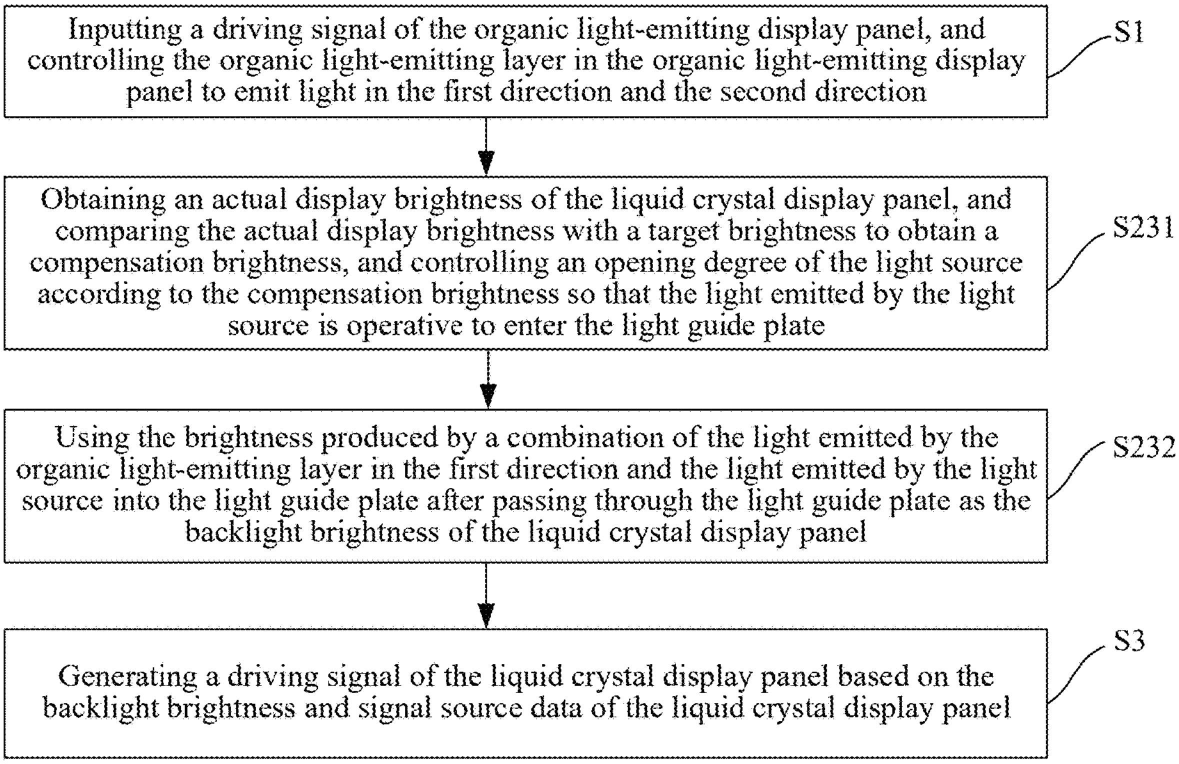
FIG. 9 is a flowchart of a driving method flow according to a sixth embodiment of the present application.
Figure 10:
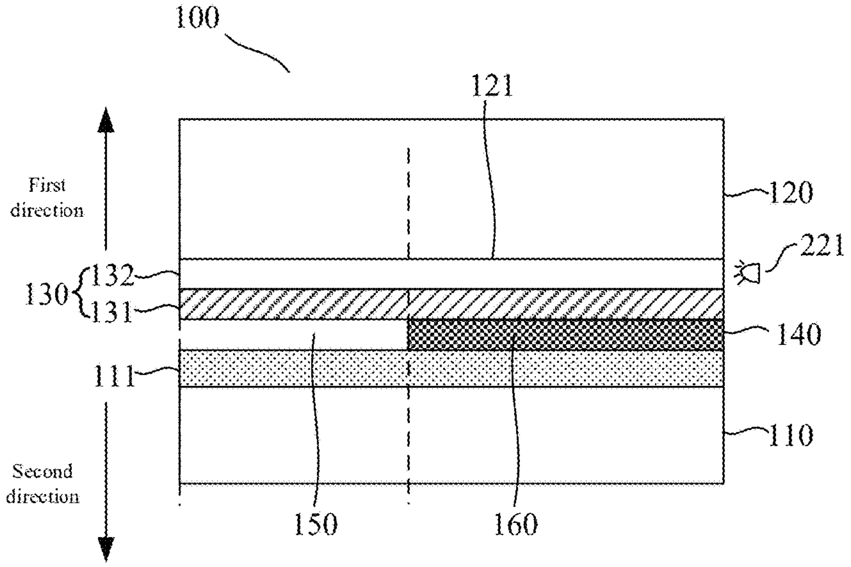
FIG. 10 is a schematic diagram of a double-sided display device according to the sixth embodiment of the present application.

Referring to FIG. 9 and FIG. 10, as a sixth embodiment of the present application, it is a further refinement of the fifth embodiment. The light diffusion structure 130 includes a diffusion sheet 131 and a light guide plate 132. The light guide plate 132 is arranged between the diffusion sheet 131 and the liquid crystal display panel 120. A light source 221 is arranged on a side of the light guide plate 132. The operation S2 includes:

- S231: obtaining the actual display brightness of the liquid crystal display panel, and comparing the actual display brightness with the target brightness to calculate and obtain the compensation brightness, and controlling an opening degree of the light source according to the compensation brightness so that the light of the light source enters the light guide plate; and
- S232: using the brightness of the light emitted by the organic light-emitting layer in the first direction and the light emitted by the light source into the light guide plate after passing through the light guide plate as the backlight brightness of the liquid crystal display panel.

Considering that sometimes when the OLED panel is displayed, some pixels have relatively high or low brightness, while the corresponding LCD panel needs relatively low or high brightness respectively at this time, the backlight brightness may be too bright or insufficient, so it is also necessary to modify and compensate the backlight brightness of the LCD panel. Accordingly, a light source 221 is disposed on the side of the liquid crystal display panel 120. A light guide plate 132 is disposed between the diffuser and the liquid crystal display panel 120. The light emitted by the light source 221 is transmitted into the light guide plate 132 to increase the backlight brightness. During the day, because the light is relatively bright, it may not be necessary to turn on the compensation mode, and the corresponding compensation module can be manually controlled not to operate. Instead, the compensation module is turned on at night. Of course, it is not limited to distinguishing between night and day, and the compensation mode can be turned on in both cases to compensate the backlight brightness. By obtaining the actual display brightness of the liquid crystal display panel 120, and comparing the actual display brightness with the target brightness to obtain the compensation brightness, the opening degree of the light source 221 is controlled according to the compensation brightness, so that the light of the light source 221 enters the light guide plate 132. The light emitted by the organic light-emitting layer 111 in the first direction and the light emitted by the light source 221 into the light guide plate 132 after passing through the light guide plate 132 are used as the backlight brightness of the liquid crystal display panel 120, thereby ensuring the display effect of the liquid crystal display panel 120.

Embodiment 7

Figure 11:
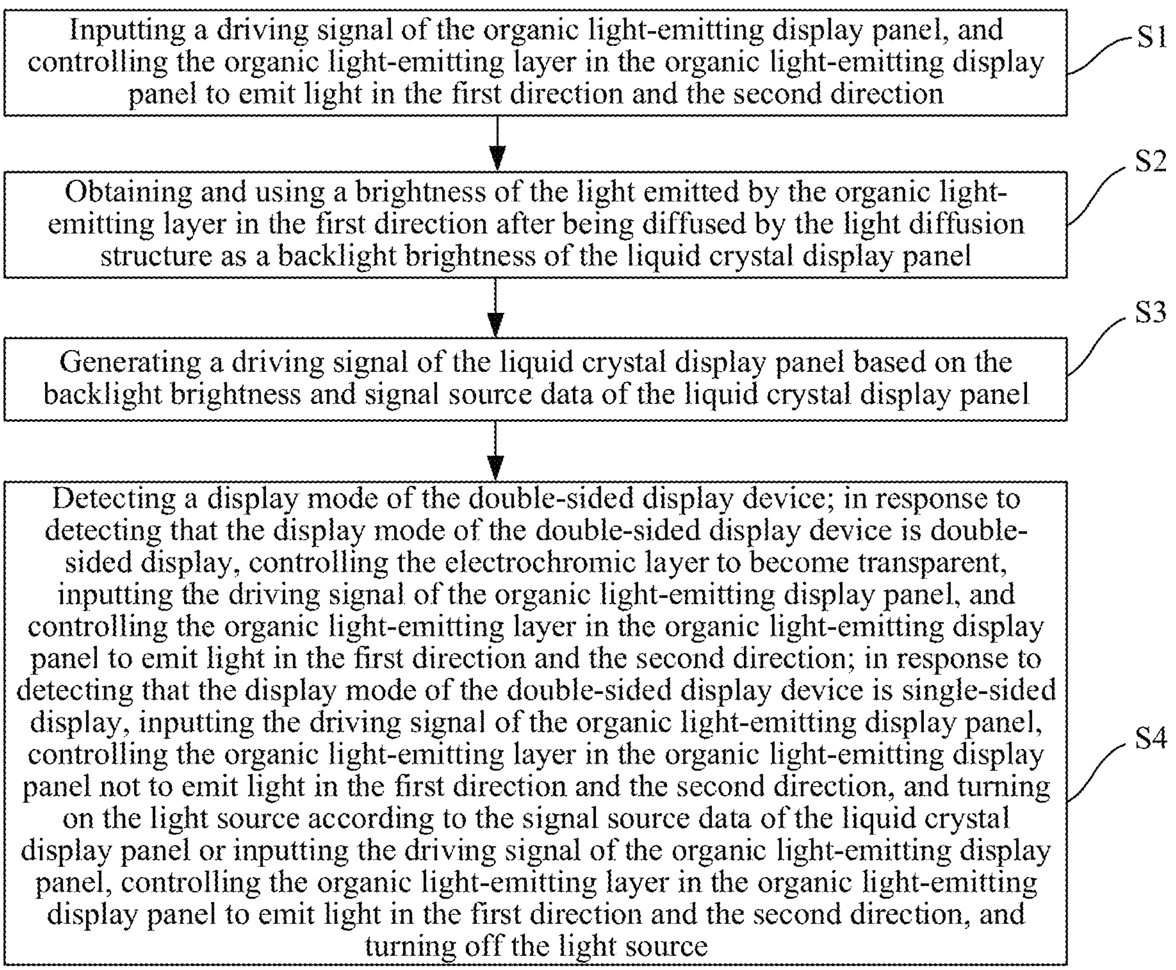
FIG. 11 is a flowchart of a driving method flow of according to a seventh embodiment of the present application.
Figure 12:
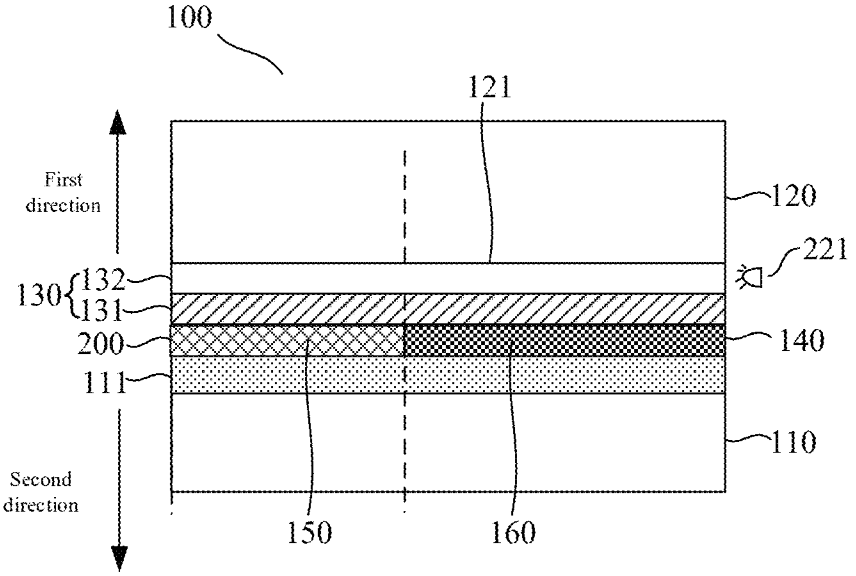
FIG. 12 is a schematic diagram of a double-sided display device according to the seventh embodiment of the present application.

Referring to FIG. 11 and FIG. 12, as a seventh embodiment of the present application, it is a further refinement of the sixth embodiment mentioned above. An electrochromic layer 200 is arranged between the light diffusion structure 130 and the organic light-emitting display panel 110. The electrochromic layer 200 and the light shielding layer 140 are arranged in the same layer. The sum of the widths of the electrochromic layer 200 and the light shielding layer 140 is greater than or equal to the sum of the widths of the opening areas 121 of the pixels of the liquid crystal display panel 120. After the operation S3, the following operations are further included:

- S4: detecting a display mode of the double-sided display device, if it is double-sided display, controlling the electrochromic layer to be transparent, inputting the driving signal of the organic light-emitting display panel, and controlling the organic light-emitting layer in the organic light-emitting display panel to emit light in the first direction and the second direction; if it is single-sided display, inputting the driving signal of the organic light-emitting display panel, controlling the organic light-emitting layer in the organic light-emitting display panel not to emit light in the first direction and the second direction, and turning on the light source according to the signal source data of the liquid crystal display panel; or inputting the driving signal of the organic light-emitting display panel, controlling the organic light-emitting layer 111 in the organic light-emitting display panel to emit light in the first direction and the second direction, and turning off the light source.

In this embodiment, an electrochromic layer 200 is added to the original double-sided display device 100. Because the driving circuits of the liquid crystal display panel 120 and the organic light-emitting display panel 110 are independent of each other, the single-sided display or double-sided display of the liquid crystal display panel 120 and the organic light-emitting display panel 110 is realized through the electrochromic layer 200. If double-sided display is required, the electrochromic layer 200 is controlled to be transparent, and the driving signal of the organic light-emitting display panel 110 is input to control the organic light-emitting layer 111 in the organic light-emitting display panel 110 to emit light in the first direction and the second direction. The light emitted by the organic light-emitting layer 111 in the first direction passes through the transparent electrochromic layer 200 and reaches the light diffusion structure 130 for diffusion, and finally serves as the backlight of the liquid crystal display panel 120, realizing the back side display of the double-sided display device 100. The light in the second direction displays the front side image on the display surface of the organic light-emitting display panel 110. If single-sided display is used, the driving signal of the organic light-emitting display panel 110 is input to control the organic light-emitting layer 111 in the organic light-emitting display panel 110 to not emit light in the first direction and the second direction, and the electrical signal of the driving circuit of the organic light-emitting display panel 110 is cut off. At this time, the light source 221 is turned on according to the signal source data of the liquid crystal display panel 120, so that the liquid crystal display panel 120 realizes single-sided display. Alternatively, the driving signal of the organic light-emitting display panel 110 is input, the organic light-emitting layer 111 in the organic light-emitting display panel 110 is controlled to emit light in the first direction and the second direction, the electrochromic layer 200 is controlled to be opaque, and the light source 221 is turned off, so that the organic light-emitting display panel 110 realizes single-sided display.

Embodiment 8

Figure 13:
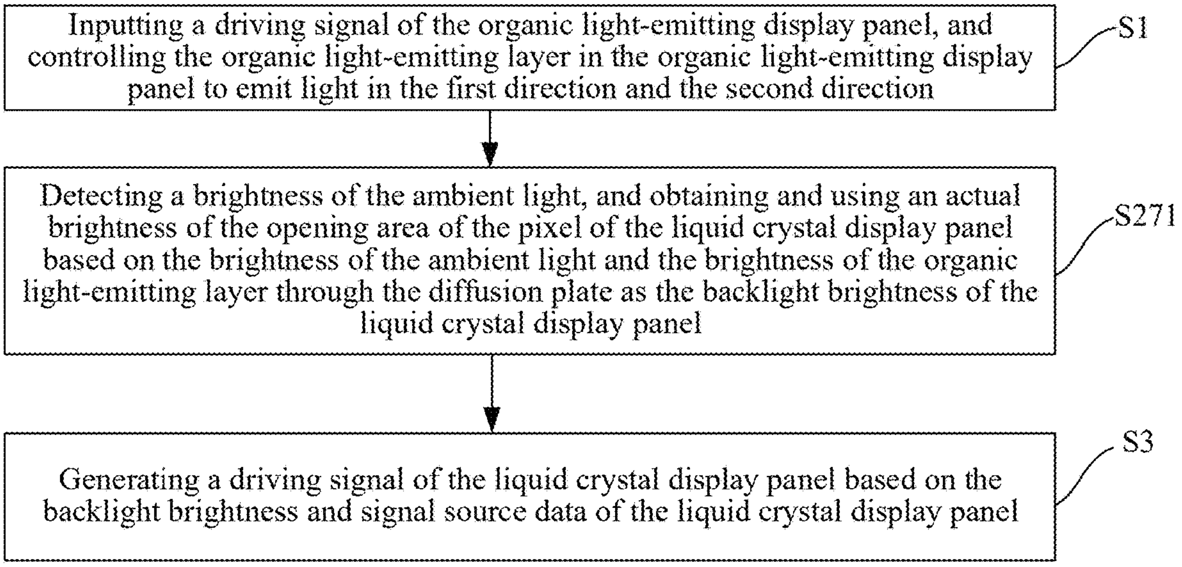
FIG. 13 is a flowchart of a driving method according to an eighth embodiment of the present application.
Figure 14:
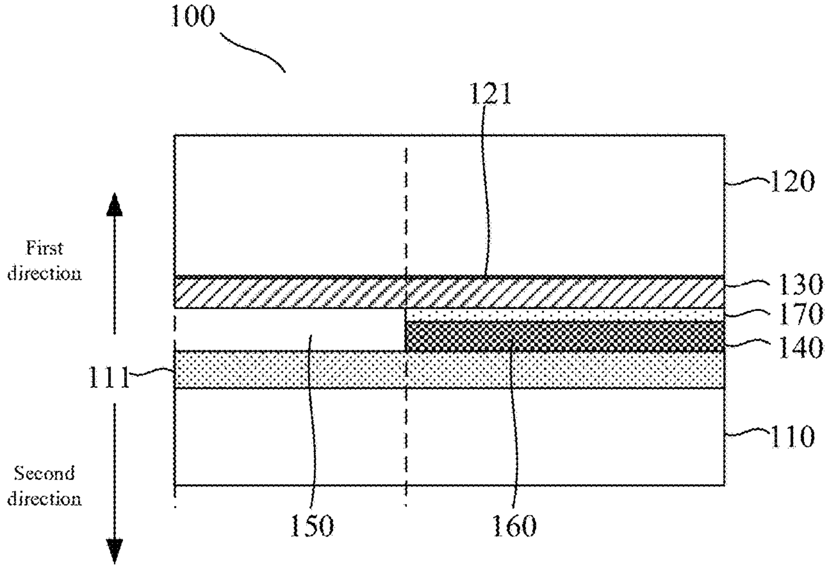
FIG. 14 is a schematic diagram of a double-sided display device according to the eighth embodiment of the present application.

Referring to FIG. 13 and FIG. 14, as an eighth embodiment of the present application, it is a further expansion and refinement of the fifth embodiment mentioned above. The double-sided display device 100 includes a first reflection layer 170. The first reflection layer 170 is arranged between the light shielding layer 140 and the light diffusion structure 130. The operation S2 includes the following:

S271: detecting the brightness of the ambient light, and obtaining the actual brightness of the opening area of the pixel of the liquid crystal display panel according to the brightness of the ambient light and the brightness of the organic light-emitting layer through the diffusion plate, as the backlight brightness of the liquid crystal display panel.

Different from the above-mentioned second embodiment, the present embodiment adds a first reflection layer 170 on the light shielding layer 140 to reflect ambient light to increase the backlight brightness of the liquid crystal display panel 120. The first reflection layer 170 reflects the ambient light of the liquid crystal passing through the liquid crystal display panel 120, so that the light passing through the organic light-emitting layer 111 from the transparent section 150 is mixed with the ambient light, and the light emitted by the organic light-emitting layer 111 and the ambient light are superimposed to increase the backlight brightness. This avoids the situation that the brightness of the organic light-emitting layer 111 of the OLED is low and the LCD needs to display high brightness but the brightness is insufficient.

In addition, a first reflection layer 170 may be arranged on the surface of the light shielding layer 140 adjacent to the organic light-emitting display panel 110, and the first reflection layer 170 may be arranged on both the upper and lower surfaces of the light shielding layer 140 to reflect the light emitted by the organic light-emitting layer 111 under the opaque section 160, thereby improving the display brightness of the organic light-emitting layer 111 on the OLED panel. In addition, it should be noted that this embodiment does not conflict with the embodiment of adding the light guide plate 132 and the light source 221. They may be used independently or in conjunction. That is, on the basis of adding the light guide plate 132 and the light source 221, the first reflection layer 170 may be arranged on the light shielding layer 140, thereby further improving the backlight brightness of the liquid crystal display panel 120.

Embodiment 9

Figure 15:
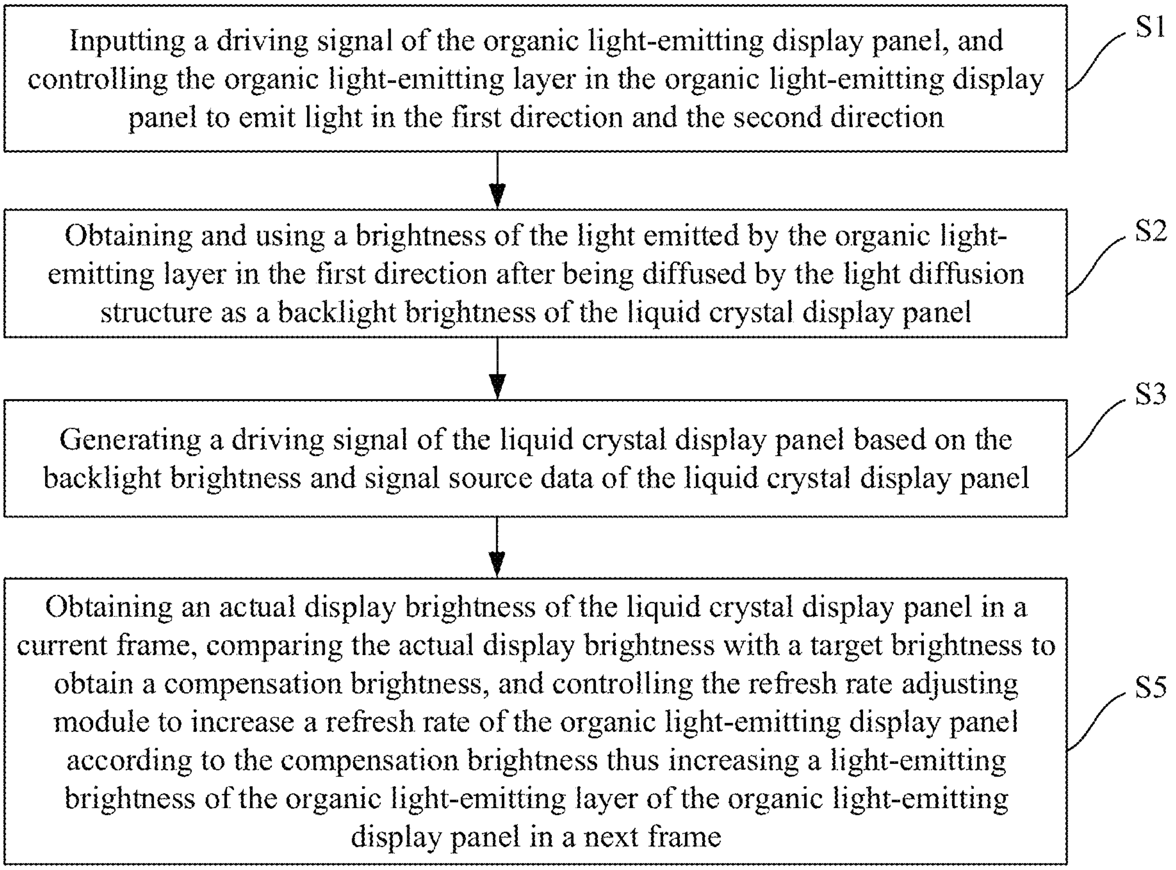
FIG. 15 is a flowchart of a driving method flow according to a ninth embodiment of the present application.
Figure 16:
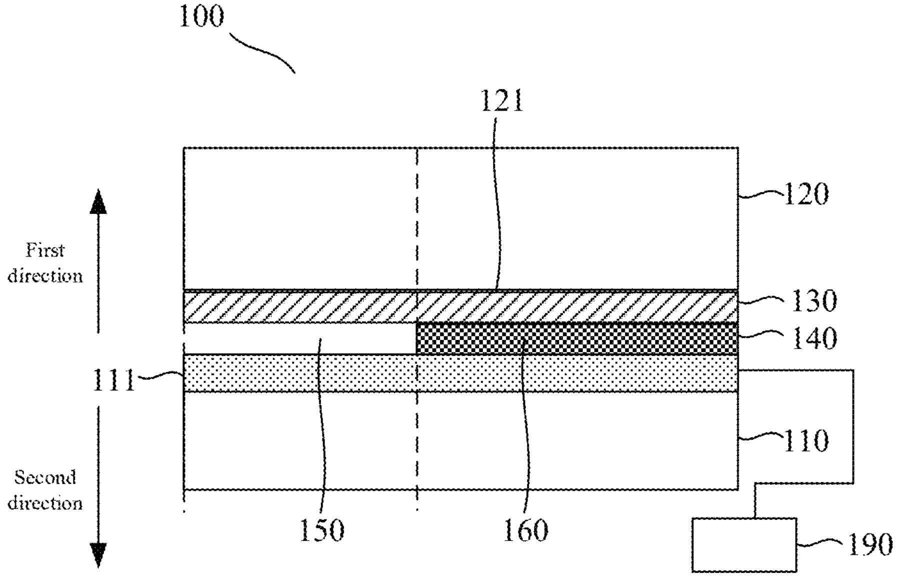
FIG. 16 is a schematic diagram of a double-sided display device according to the ninth embodiment of the present application.

Referring to FIG. 15 and FIG. 16, as a ninth embodiment of the present application, it is a further expansion and improvement of any of the above embodiments. The organic light-emitting display panel 110 further includes a refresh rate adjusting module 190. The refresh rate adjusting module 190 controls a refresh rate of the organic light-emitting display panel 110. The following operations are included after S3:

S5: obtaining the actual display brightness of the liquid crystal display panel of the current frame, and comparing the actual display brightness with the target brightness to calculate and obtain a compensation brightness, and controlling the refresh rate adjusting module to increase the refresh rate of the organic light-emitting display panel according to the compensation brightness, so as to increase the light-emitting brightness of the organic light-emitting layer of the organic light-emitting display panel in the next frame.

The difference between this embodiment and the above embodiment is that this embodiment mainly adjusts the light-emitting brightness of the most original light-emitting device, that is, the organic light-emitting layer 111. When the backlight brightness of the liquid crystal display panel 120 is insufficient, the OLED pixel display surface is adjusted to a high refresh mode. That is, the OLED display brightness of several frames is used for the display brightness of one frame of the liquid crystal display panel 120, thus associating the compensation value with the refresh rate. Different compensation values correspond to different refresh rates. The larger the compensation value, the larger the corresponding refresh rate, but it cannot exceed the rated refresh rate of the OLED pixel (that is, the maximum refresh rate set independently) to avoid affecting the display of the OLED display surface. In this embodiment, on the basis of turning on the OLED pixels to compensate the liquid crystal display panel 120 pixels, the refresh rate can be further adjusted to improve the brightness compensation value of the OLED pixels to the LCD pixels.

It should be noted that the limitations of the various steps involved in this solution are not to be interpreted to limit the order of the steps, under the premise of not affecting the implementation of the specific solution. For example, detecting the state of the display device and detecting the display mode of the display device can be detected at the same time, or the state of the display device can be detected first before detecting the display mode of the display device, or the display mode of the display device can be detected first before detecting the state of the display device. That is, the steps written earlier can be executed first, or later, or even at the same time with the steps written later. As long as this solution can be implemented, it should be regarded as falling in the scope of protection of this application.

It should be noted that the inventive concept of the present application can be formed into many embodiments, but the length of the application document is limited and so these embodiments cannot be enumerated one by one. Therefore, should no conflict be present, the various embodiments or technical features described above can be arbitrarily combined to form new embodiments. After the various embodiments or technical features are combined, the original technical effects may be enhanced.

The foregoing is a further detailed description of the present application with reference to some specific optional implementations, but it cannot be determined that the specific implementation of the present application is limited to these implementations. For those having ordinary skill in the technical field to which the present application pertains, several deductions or substitutions may be made without departing from the concept of the present application, and all these deductions or substitutions should be regarded as falling in the scope of protection of the present application.

What is claimed is:

1. A double-sided display device, comprising a liquid crystal display panel and an organic light-emitting display panel that are arranged opposite to each other, wherein the organic light-emitting display panel comprises an organic light-emitting layer, wherein there is arranged a light diffusion structure between each pixel of the organic light-emitting display panel and a respective pixel of the liquid crystal display panel, wherein there is arranged a light shielding layer between the light diffusion structure and each pixel of the organic light-emitting display panel, wherein the light shielding layer has a width less than a width of an opening area of each pixel of the liquid crystal display panel; wherein the organic light-emitting layer is operative to emit light in a first direction and a second direction, the first direction and the second direction being opposite directions; wherein the light in the first direction is partially shielded by the light shielding layer, and is partially operative to pass through the light diffusion structure to reach the opening area of each pixel of the liquid crystal display panel to realize display of the liquid crystal display panel, wherein the light in the second direction is operative to display a front side image on a display surface of the organic light-emitting display panel;

wherein the light diffusion structure comprises a light guide plate and a diffusion sheet, wherein the light guide plate is disposed between the diffusion sheet and the liquid crystal display panel; wherein the light guide plate has a width that is greater than a width of the opening area of each pixel of the liquid crystal display panel and less than or equal to a width of the diffusion sheet.

2. The double-sided display device as recited in claim 1, further comprising a brightness detection module and a light source compensation module, wherein the brightness detection module is configured to obtain an actual display brightness, wherein the light source compensation module comprises a light source and a compensation circuit electrically connected to the light source, wherein the light source is arranged on a side of the light guide plate; wherein the brightness detection module is electrically connected to the compensation circuit, and is configured to obtain an actual display brightness of the liquid crystal display panel, and compare the actual display brightness with a target brightness to calculate a compensation brightness; wherein the compensation circuit is configured to input a corresponding electrical signal to the light source according to the compensation brightness to control a light-emitting brightness of the light source.

3. The double-sided display device as claimed in claim 2, wherein the organic light-emitting layer is operative to emit white light, wherein the light source is arranged around the liquid crystal display panel, wherein the light source comprises a white light OLED; wherein there is disposed a reflective film layer above the white light OLED and further disposed another reflective film layer below the white light OLED, so that the light emitted by the OLED white light source is guided into a display area of the liquid crystal display panel through the light guide plate for use by the liquid crystal display panel.

4. The double-sided display device as recited in claim 2, wherein the light source is arranged around the liquid crystal display panel, wherein the light source comprises a white light OLED arranged in a same layer as the organic light-emitting layer, wherein the liquid crystal panel comprises a second reflection layer disposed in a region corresponding to the white light OLED, wherein the organic light-emitting display panel comprises an opaque section disposed in a region corresponding to the white light OLED.

5. The double-sided display device as recited in claim 1, further comprising a first reflection layer, which is arranged between the light shielding layer and the light diffusion structure, and arranged on and covered a surface of the light shielding layer facing towards the liquid crystal display panel.

6. The double-sided display device as recited in claim 1, wherein there is further arranged an electrochromic layer between the diffusion sheet and the organic light-emitting display panel, wherein the electrochromic layer and the light shielding layer are arranged in a same layer, and wherein there is arranged a transparent glass substrate between the electrochromic layer and the diffusion sheet.

7. The double-sided display device as recited in claim 6, wherein a sum of widths of the electrochromic layer and the light shielding layer corresponding to each pixel of the liquid crystal panel is equal to a width of an opening area of each pixel of the liquid crystal display panel.

8. The double-sided display device as claimed in claim 7, wherein there is further disposed a black matrix in a pixel area of the pixels of the liquid crystal display panel; wherein the opening area is formed between the black matrix; wherein a sum of a width of the black matrix and a width of the pixel opening area is equal to a width of the organic light-emitting layer corresponding to each pixel of the liquid crystal display panel.

9. The double-sided display device as recited in claim 6, wherein the electrochromic layer has a thickness that is equal to a width of a gap between the organic light-emitting layer and the diffusion sheet.

10. The double-sided display device as recited in claim 1, further comprising a first reflection layer arranged between the light shielding layer and the light diffusion structure, wherein the first reflection layer is arranged to cover a surface of the light shielding layer facing towards the liquid crystal display panel.

11. The double-sided display device as recited in claim 1, wherein there is disposed a glass substrate on a surface of the liquid crystal display panel facing away from the organic light-emitting display panel and there is further disposed another glass substrate on a surface of the organic light-emitting display panel facing away from the liquid crystal display panel.

12. The double-sided display device as recited in claim 1, wherein the organic light-emitting display panel comprises a color film arranged on a side of the organic light-emitting layer facing away from the liquid crystal display panel, wherein the color film comprises a plurality of color filters and a black matrix arranged between different color filters.

13. A double-sided display device, comprising a liquid crystal display panel and an organic light-emitting display panel arranged opposite to each other, wherein the organic light-emitting display panel comprises an organic light-emitting layer, wherein there is arranged a light diffusion structure between each pixel of the organic light-emitting display panel and a respective pixel of the liquid crystal display panel, wherein there is arranged a light shielding layer between the light diffusion structure and each pixel of the organic light-emitting display panel, wherein the light shielding layer has a width less than a width of an opening area of each pixel of the liquid crystal display panel; wherein the organic light-emitting layer is operative to emit light in a first direction and a second direction, the first direction and the second direction being opposite directions; wherein the light in the first direction is partially shielded by the light shielding layer, and is partially operative to pass through the light diffusion structure to reach the opening area of each pixel of the liquid crystal display panel to realize display of the liquid crystal display panel, wherein the light in the second direction is operative to display a front side image on a display surface of the organic light-emitting display panel;

wherein there is further arranged an electrochromic layer between the diffusion sheet and the organic light-emitting display panel, wherein the electrochromic layer and the light shielding layer are arranged in a same layer, and wherein there is arranged a transparent glass substrate between the electrochromic layer and the diffusion sheet; wherein a sum of widths of the electrochromic layer and the light shielding layer corresponding to each pixel of the liquid crystal panel is equal to a width of an opening area of each pixel of the liquid crystal display panel;

wherein there is further disposed a black matrix in a pixel area of the pixels of the liquid crystal display panel; wherein the opening area is formed between the black matrix; wherein a sum of a width of the black matrix and a width of the pixel opening area is equal to a width of the organic light-emitting layer corresponding to each pixel of the liquid crystal display panel.

14. A driving method for a double-sided display device wherein the double-sided display device comprises a liquid crystal display panel and an organic light-emitting display panel that are arranged opposite to each other, wherein the organic light-emitting display panel comprises an organic light-emitting layer, wherein there is arranged a light diffusion structure between each pixel of the organic light-emitting display panel and a respective pixel of the liquid crystal display panel, wherein there is arranged a light shielding layer between the light diffusion structure and each pixel of the organic light-emitting display panel, wherein the light shielding layer has a width less than a width of an opening area of each pixel of the liquid crystal display panel; wherein the organic light-emitting layer is operative to emit light in a first direction and a second direction, the first direction and the second direction being opposite directions; wherein the light in the first direction is partially shielded by the light shielding layer, and is partially operative to pass through the light diffusion structure to reach the opening area of each pixel of the liquid crystal display panel to realize display of the liquid crystal display panel, wherein the light in the second direction is operative to display a front side image on a display surface of the organic light-emitting display panel; wherein the driving method comprises:

inputting a driving signal of the organic light-emitting display panel, and controlling the organic light-emitting layer in the organic light-emitting display panel to emit light in the first direction and the second direction;

obtaining and using a brightness of the light emitted by the organic light-emitting layer in the first direction after being diffused by the light diffusion structure as a backlight brightness of the liquid crystal display panel; and generating a driving signal of the liquid crystal display panel based on the backlight brightness and signal source data of the liquid crystal display panel;

where the first direction and the second direction are opposite directions, the light from the first direction is used to display a back side image on a display surface of the liquid crystal display panel, and the light in the second direction is used to display the front side image on the display surface of the organic light-emitting display panel.

15. The driving method as recited in claim 14, wherein the light diffusion structure comprises a light guide plate and a diffusion plate, wherein the light guide plate is arranged between the light diffusion structure and the liquid crystal display panel, where there is further arranged a light source for supplementing light on a side of the light guide plate, and wherein the operation of obtaining and using the brightness of the light emitted by the organic light-emitting layer in the first direction after being diffused by the light diffusion structure as the backlight brightness of the liquid crystal display panel comprises:

obtaining an actual display brightness of the liquid crystal display panel, and comparing the actual display brightness with a target brightness to obtain a compensation brightness, and controlling an opening degree of the light source according to the compensation brightness so that the light emitted by the light source is operative to enter the light guide plate; and using the brightness produced by a combination of the light emitted by the organic light-emitting layer in the first direction and the light emitted by the light source into the light guide plate after passing through the light guide plate as the backlight brightness of the liquid crystal display panel.

16. The driving method as recited in claim 15, wherein there is further arranged an electrochromic layer between the light diffusion structure and the organic light-emitting display panel, wherein the electrochromic layer and the light shielding layer are arranged in the same layer, wherein a sum of widths of the electrochromic layer and the light shielding layer is greater than or equal to a width of an opening area of each pixel of the liquid crystal display panel; wherein the driving method further comprises the following operations subsequent to the operation of generating the driving signal of the liquid crystal display panel based on the backlight brightness and the signal source data of the liquid crystal display panel:

detecting a display mode of the double-sided display device;

in response to detecting that the display mode of the double-sided display device is double-sided display, controlling the electrochromic layer to become transparent, inputting the driving signal of the organic light-emitting display panel, and controlling the organic light-emitting layer in the organic light-emitting display panel to emit light in the first direction and the second direction;

in response to detecting that the display mode of the double-sided display device is single-sided display, inputting the driving signal of the organic light-emitting display panel, controlling the organic light-emitting layer in the organic light-emitting display panel not to emit light in the first direction and the second direction, and turning on the light source according to the signal source data of the liquid crystal display panel; or inputting the driving signal of the organic light-emitting display panel, controlling the organic light-emitting layer in the organic light-emitting display panel to emit light in the first direction and the second direction, controlling the electrochromic layer to become opaque, and turning off the light source.

17. The driving method as recited in claim 14, wherein the organic light-emitting display panel includes a refresh rate adjusting module configured to control a refresh rate of the organic light-emitting display panel; wherein the operation of generating the driving signal of the liquid crystal display panel based on the backlight brightness and the source data of the liquid crystal display panel comprises:

obtaining an actual display brightness of the liquid crystal display panel in a current frame, comparing the actual display brightness with a target brightness to obtain a compensation brightness, and controlling the refresh rate adjusting module to increase a refresh rate of the organic light-emitting display panel according to the compensation brightness thus increasing a light-emitting brightness of the organic light-emitting layer of the organic light-emitting display panel in a next frame.

18. The driving method as recited in claim 14, wherein the double-sided display device comprises a first reflection layer disposed between the light shielding layer and the light diffusion structure, and wherein the operation of obtaining and using the brightness of the light emitted by the organic light-emitting layer in the first direction after being diffused by the light diffusion structure as the backlight brightness of the liquid crystal display panel comprises:

detecting a brightness of the ambient light, and obtaining and using an actual brightness of the opening area of the pixel of the liquid crystal display panel based on the brightness of the ambient light and the brightness of the organic light-emitting layer through the diffusion plate as the backlight brightness of the liquid crystal display panel.

* * * * *